(12) United States Patent
Shin et al.

(10) Patent No.: US 11,699,605 B2
(45) Date of Patent: Jul. 11, 2023

(54) APPARATUS FOR TREATING SUBSTRATE

(71) Applicant: SEMES CO., LTD., Cheonan-si (KR)

(72) Inventors: Kyungsik Shin, Asan-si (KR); Jung-Hyun Lee, Cheonan-si (KR); Jinki Shin, Busan (KR); Seo Jung Park, Goyang-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 486 days.

(21) Appl. No.: 16/871,118

(22) Filed: May 11, 2020

(65) Prior Publication Data

US 2020/0357663 A1    Nov. 12, 2020

(30) Foreign Application Priority Data

May 9, 2019   (KR) .................. 10-2019-0054288

(51) Int. Cl.
*H01L 21/67*       (2006.01)
*H01L 21/687*      (2006.01)

(52) U.S. Cl.
CPC .... *H01L 21/6715* (2013.01); *H01L 21/67109* (2013.01); *H01L 21/68707* (2013.01); *H01L 21/68742* (2013.01)

(58) Field of Classification Search
CPC combination set(s) only.
See application file for complete search history.

(56) References Cited

U.S. PATENT DOCUMENTS

| 2017/0121820 A1* | 5/2017 | Chung | C23C 16/52 |
| 2019/0071777 A1* | 3/2019 | Yoshida | C23C 16/45546 |
| 2019/0145002 A1* | 5/2019 | Um | C23C 16/45557 |
| | | | 118/722 |

FOREIGN PATENT DOCUMENTS

| JP | 2002-025988 A | 1/2002 |
| JP | 2009-224441 A | 10/2009 |
| KR | 10-2006-0096460 A | 9/2006 |
| KR | 10-2007-0078073 A | 7/2007 |
| KR | 10-2014-0055900 A | 5/2014 |
| KR | 101935945 B1 | 1/2019 |

OTHER PUBLICATIONS

Korean Office Action dated Jun. 2, 2020 issued in corresponding Korean Appln. No. 10-2019-0054288.
Korean Notice of Allowance dated Oct. 21.2020 issued in corresponding Korean Appln. No. 10-2019-0054288.

* cited by examiner

*Primary Examiner* — Ratisha Mehta
(74) *Attorney, Agent, or Firm* — Harness, Dickey & Pierce, P.L.C.

(57) ABSTRACT

An apparatus for treating a substrate includes a chamber having a treating space formed therein, a substrate support unit that supports the substrate in the treating space, a plate that is located to face the substrate support unit in the treating space and that has a plurality of holes formed therein, a gas supply unit that supplies gas into the treating space through the holes, and a gas exhaust unit that exhausts the gas in the treating space through the holes.

20 Claims, 16 Drawing Sheets

A-A'

B-B'

APPARATUS FOR TREATING SUBSTRATE

CROSS-REFERENCE TO RELATED APPLICATIONS

A claim for priority under 35 U.S.C. § 119 is made to Korean Patent Application No. 10-2019-0054288 filed on May 9, 2019, in the Korean Intellectual Property Office, the entire contents of which are hereby incorporated by reference.

BACKGROUND

Embodiments of the inventive concept described herein relate to an apparatus for treating a substrate.

Various processes, such as cleaning, deposition, photolithography, coating, etching, ion implantation, and the like, are performed to manufacture semiconductor devices. Among these processes, the deposition process and the coating process are used to form a film on a substrate. In general, the deposition process is a process of forming a film by depositing a process gas on a substrate, and the coating process is a process of forming a liquid film by applying a treating liquid to a substrate.

A process of baking a substrate is performed before and after a film is formed on the substrate. The bake process is a process of heating the substrate to a process temperature or more in a closed space. In the bake process, the entire area of the substrate is uniformly heated, or temperatures of respective areas of the substrate are adjusted.

FIG. 1 is a sectional perspective view illustrating a general bake process apparatus, and FIG. 2 illustrates data showing a gas flow in the apparatus of FIG. 1. Referring to FIGS. 1 and 2, the bake process apparatus exhausts gas introduced from an edge area of a substrate to a central area thereof. Therefore, gas flow rates for the respective areas differ from each other. In particular, the gas in the apparatus is seriously focused on the central area of the substrate. As a result, pressures for respective areas in the apparatus differ from each other, which results in different temperatures for the respective areas of the substrate.

SUMMARY

Embodiments of the inventive concept provide an apparatus for uniformly heating areas of a substrate.

In addition, embodiments of the inventive concept provide an apparatus for uniformly adjusting gas flow rates for respective areas in the apparatus.

According to an exemplary embodiment, an apparatus for treating a substrate is provided.

The apparatus includes a chamber having a treating space formed therein, a substrate support unit that supports the substrate in the treating space, a plate that is located to face the substrate support unit in the treating space and that has a plurality of holes formed therein, a gas supply unit that supplies gas into the treating space through the holes, and a gas exhaust unit that exhausts the gas in the treating space through the holes. The plate has a plurality of first exhaust holes and a plurality of first supply holes formed in a central area thereof, in which the first exhaust holes exhaust the gas in an intervening space between the plate and the substrate support unit, and the first supply holes are surrounded by the first exhaust holes and supply the gas into the intervening space. The plate has a plurality of second supply holes that are formed outside the central area thereof and that supply the gas into the intervening space.

The plate may have a second exhaust hole formed therein, and the second exhaust hole may be located outside the second supply holes and may exhaust the gas in the intervening space.

A diffusion space connected to the first supply holes and the second supply holes may be formed inside the plate.

The apparatus may further include an intermediate body coupled to an upper surface of the plate, and the intermediate body may have a buffer space in which the gas introduced from the outside is firstly spread before delivered to the diffusion space.

A plurality of buffer holes that connect the buffer space and the diffusion space may be formed in the bottom of the intermediate body. When viewed from above, the buffer space may be located to cover the first supply holes, and the buffer holes may be located so as not to overlap the first supply holes.

The intermediate body may have a stepped shape having a recess formed on an upper surface thereof, and the upper surface of the intermediate body may be combined with a ceiling of the chamber to form a first exhaust space. The first exhaust holes may extend upward independently of the diffusion space and the buffer space and may connect to the first exhaust space, and the gas exhaust unit may include a first pressure-reducing member that evacuates the first exhaust space.

The intermediate body may have a smaller width than the plate, the second exhaust hole may be connected to a second exhaust space formed by a combination of the plate, the ceiling, and the intermediate body, and the gas exhaust unit may include a second pressure-reducing member that evacuates the second exhaust space.

According to an exemplary embodiment, an apparatus for treating a substrate includes a chamber having a treating space formed therein, a substrate support unit that supports the substrate in the treating space, a gas flow generation unit including a plate that is located to face the substrate support unit in the treating space and that has a plurality of holes formed therein, a gas supply line that supplies gas to some of the holes, and a gas exhaust line that exhausts the gas from other holes. The plate has a plurality of first supply holes and a plurality of first exhaust holes formed in a first area thereof and a plurality of second supply holes and a plurality of second exhaust holes formed in a second area thereof, in which the first area contains the center of the plate, and the second area surrounds the first area.

When viewed from above, the first supply holes may be located to overlap the center of the plate, the first exhaust holes may be located to surround the first supply holes, and the second exhaust holes may be located to surround the second supply holes.

A diffusion space connected to the first supply holes and the second supply holes may be formed inside the plate, the gas flow generation unit may further include an intermediate body coupled to the plate to connect the gas supply line and the gas exhaust line to the holes formed in the plate, and the intermediate body may have a buffer space formed therein and a plurality of buffer holes formed in the bottom thereof, in which the gas supply line may be connected to the buffer space, and the buffer holes may connect the buffer space and the diffusion space.

When viewed from above, the buffer space may be located to cover the first area, and the buffer holes may be located so as not to overlap the first supply holes.

The intermediate body may have a container shape having a recess formed on an upper surface thereof, the first exhaust holes may extend from the plate to the recess, and the first exhaust holes may be provided independently of the diffusion space and the buffer space.

An upper surface of the intermediate body and a ceiling of the chamber may be combined with each other to form a first exhaust space connected to the first exhaust holes, and the plate may be located below the intermediate body so as to be spaced apart from the ceiling of the chamber and may form a second exhaust space connected to the second exhaust holes. The gas exhaust line may include a first line connected to the first exhaust space and a second line connected to the second exhaust space.

A pressure-reducing member may be connected to each of the first line and the second line.

When viewed from above, the first exhaust holes may be located to overlap the first exhaust space.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
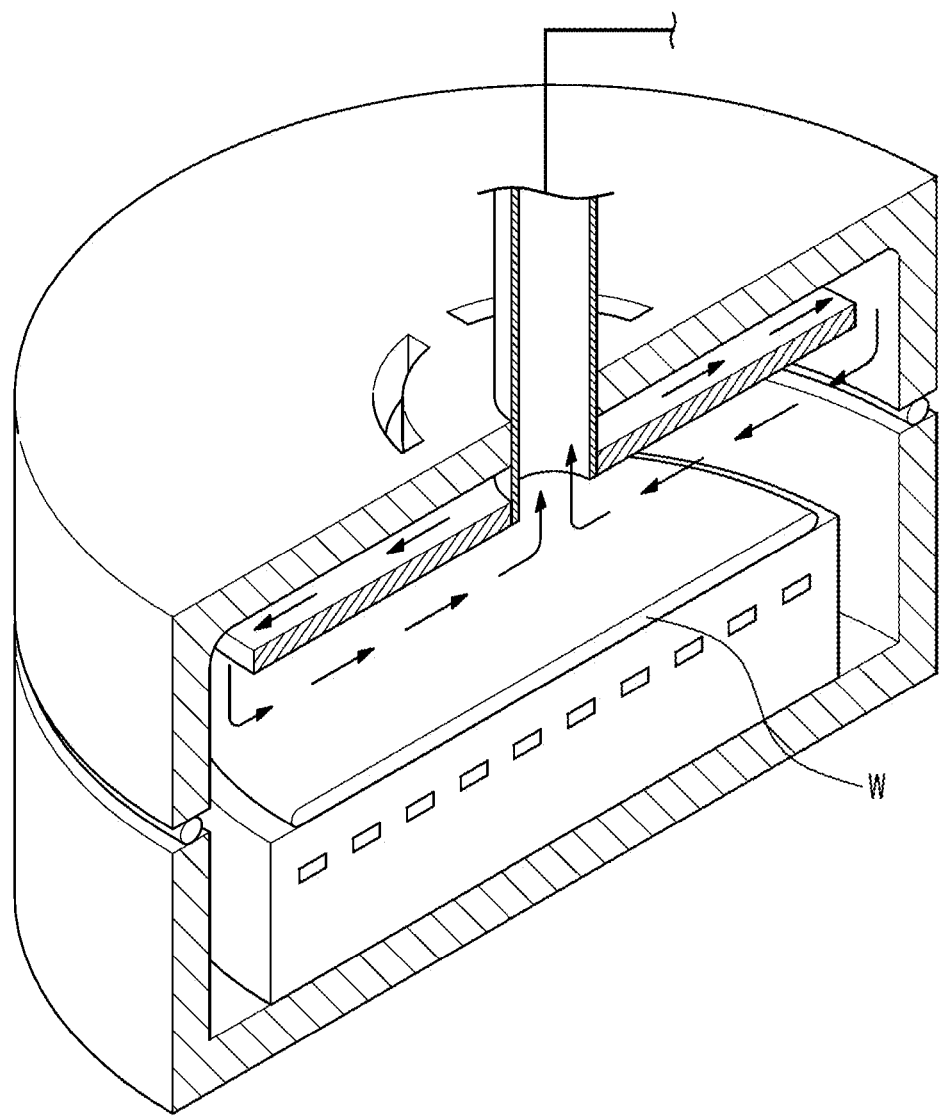
FIG. 1 is a sectional perspective view illustrating a general bake process apparatus.
Figure 2:
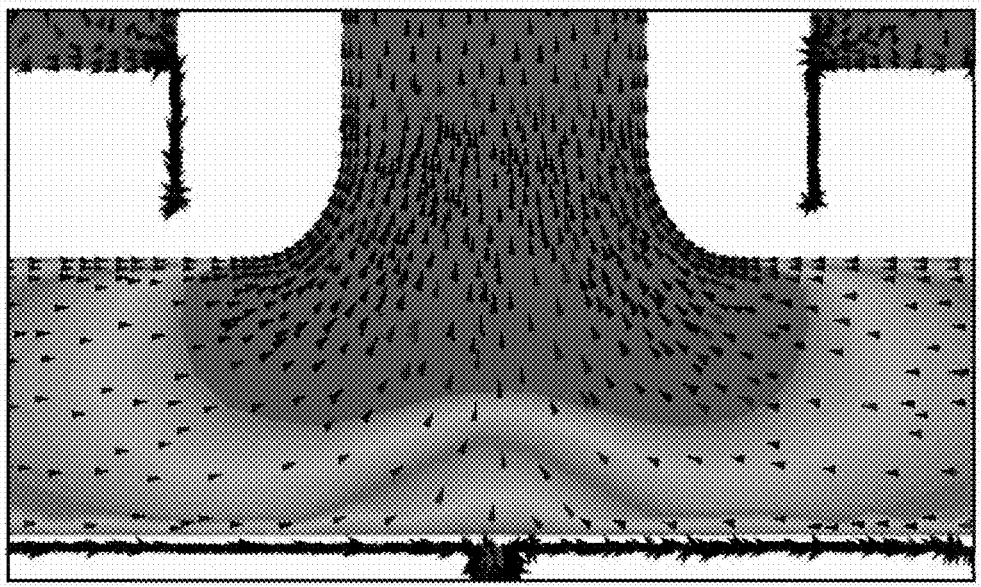
FIG. 2 illustrates data showing a gas flow in the apparatus of FIG. 1.

Hereinafter, embodiments of inventive concept will be described in more detail with reference to the accompanying drawings. Various modifications and variations can be made to embodiments of the inventive concept, and the scope of the inventive concept should not be construed as limited to the embodiments set forth herein. These embodiments are provided so that this disclosure will be thorough and complete, and will fully convey the scope of the inventive concept to those skilled in the art. Accordingly, in the drawings, the shapes of components are exaggerated for clarity of illustration.

Figure 3:
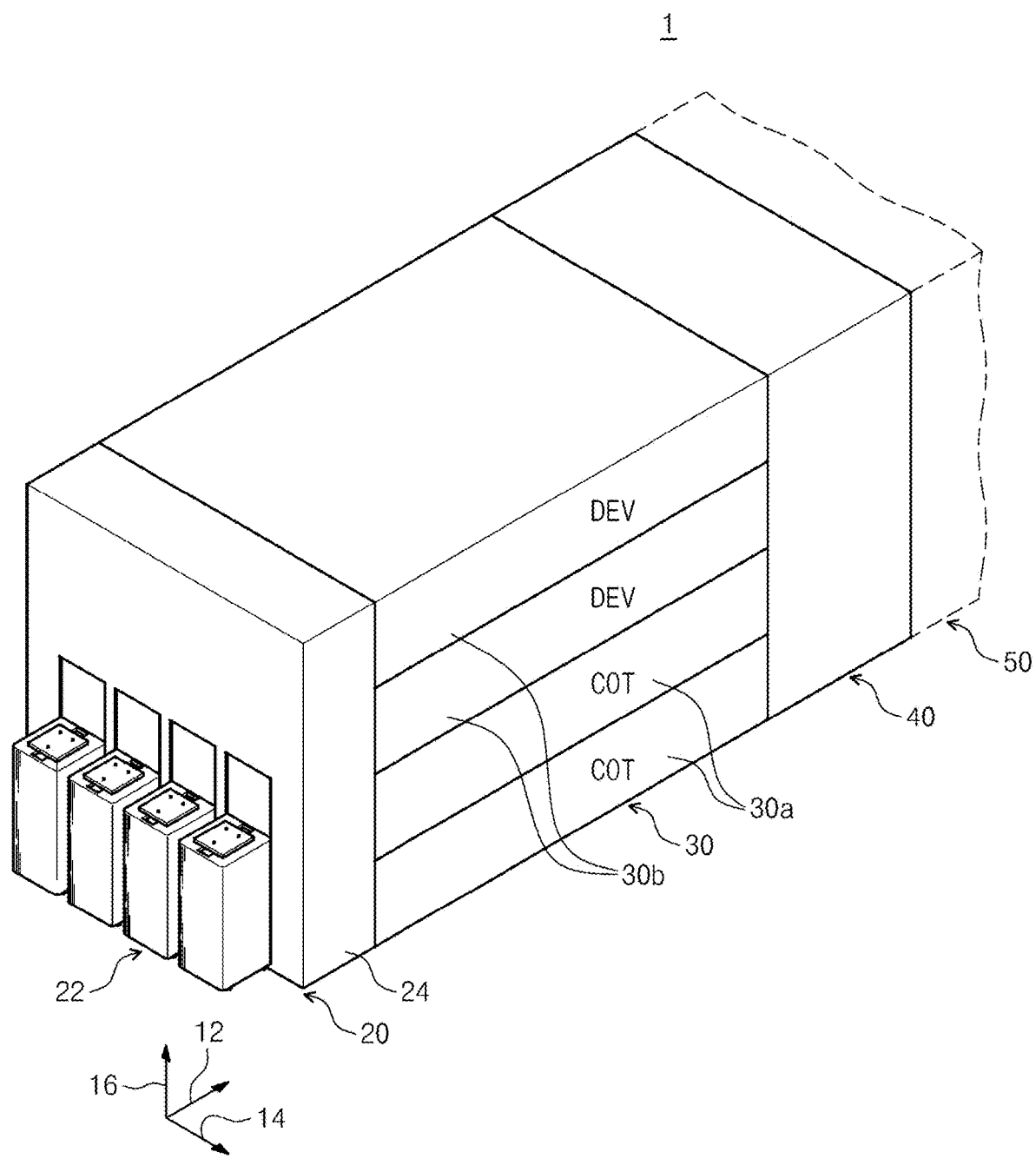
FIG. 3 is a schematic perspective view illustrating a substrate treating apparatus according to an embodiment of the inventive concept.
Figure 4:
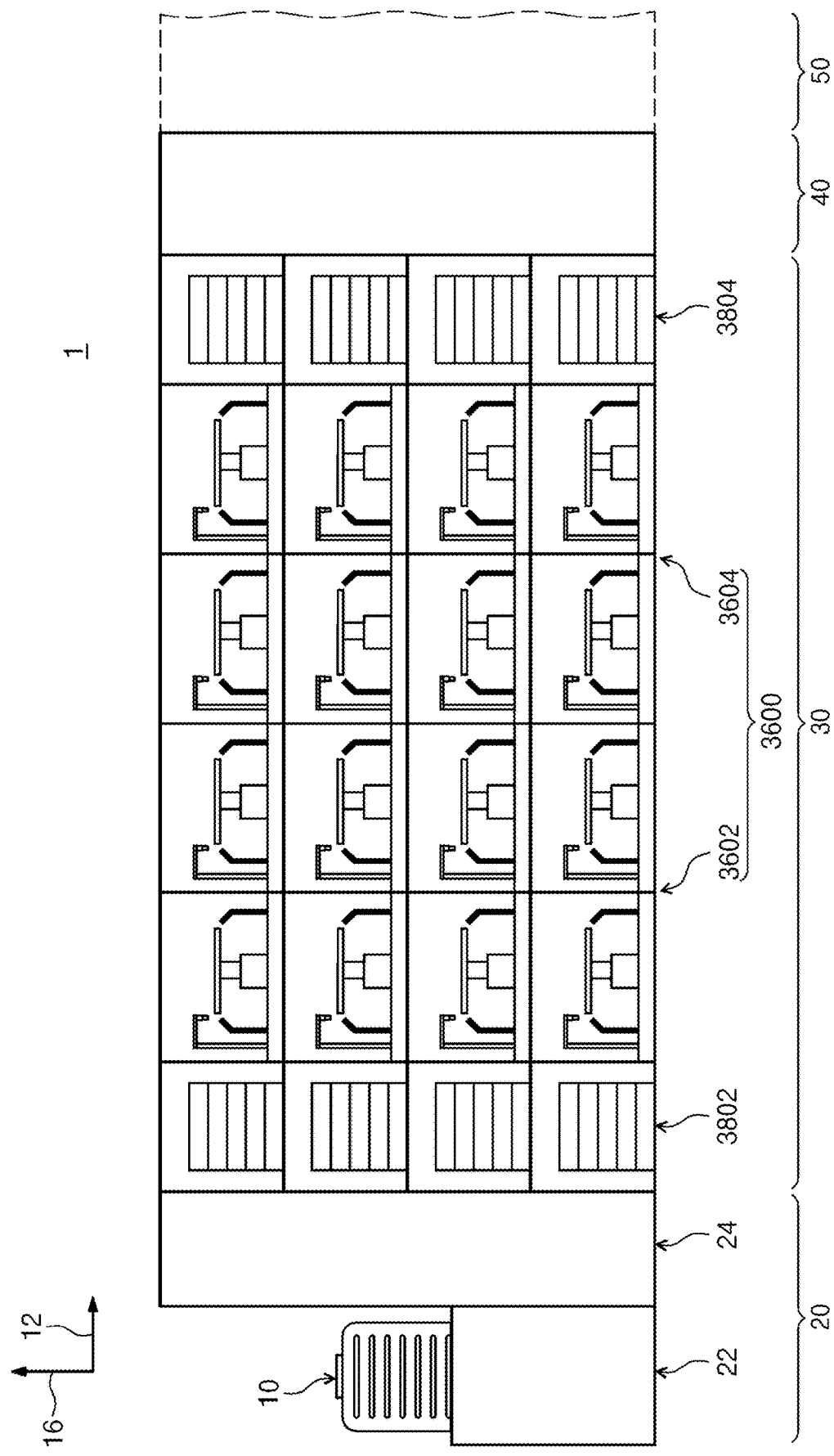
FIG. 4 is a sectional view illustrating coating blocks and developing blocks of the substrate treating apparatus of FIG. 3.
Figure 5:
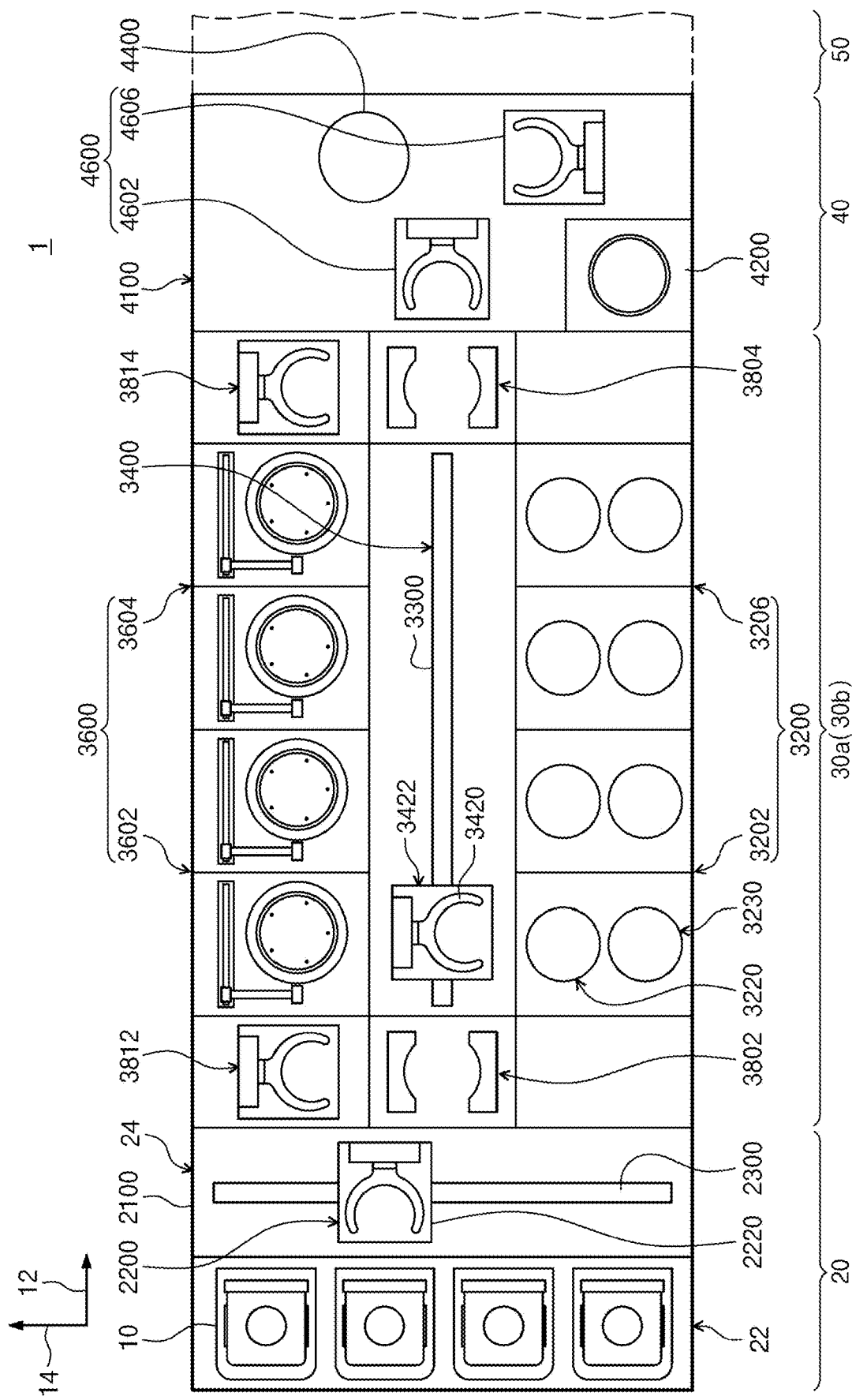
FIG. 5 is a plan view of the substrate treating apparatus of FIG. 3.

FIG. 3 is a schematic perspective view illustrating a substrate treating apparatus according to an embodiment of the inventive concept. FIG. 4 is a sectional view illustrating coating blocks and developing blocks of the substrate treating apparatus of FIG. 3. FIG. 5 is a plan view of the substrate treating apparatus of FIG. 3. Referring to FIGS. 3 to 5, the substrate treating apparatus 1 includes an index module 20, a treating module 30, and an interface module 40. According to an embodiment, the index module 20, the treating module 30, and the interface module 40 are sequentially disposed in a row. Hereinafter, the direction in which the index module 20, the treating module 30, and the interface module 40 are arranged is referred to as a first direction 12, a direction perpendicular to the first direction 12 when viewed from above is referred to as a second direction 14, and a direction perpendicular to both the first direction 12 and the second direction 14 is referred to as a third direction 16.

The index module 20 transfers substrates W from carriers 10 having the substrates W received therein to the treating module 30 and places the completely treated substrates W in the carriers 10. The lengthwise direction of the index module 20 is parallel to the second direction 14. The index module 20 has load ports 22 and an index frame 24. The load ports 22 are located on the opposite side to the treating module 30 with respect to the index frame 24. The carriers 10 having the substrates W received therein are placed on the load ports 22. The load ports 22 may be disposed along the second direction 14.

Airtight carriers 10 such as front open unified pods (FOUPs) may be used as the carriers 10. The carriers 10 may be placed on the load ports 22 by a transfer means (not illustrated) such as an overhead transfer, an overhead conveyor, or an automatic guide vehicle, or by an operator.

An index robot 2200 is provided in the index frame 24. A guide rail 2300, the lengthwise direction of which is parallel to the second direction 14, is provided in the index frame 24, and the index robot 2200 is movable on the guide rail 2300. The index robot 2200 includes a hand 2220 on which the substrate W is placed, and the hand 2220 is movable forward and backward, rotatable about an axis oriented in the third direction 16, and movable along the third direction 16.

The treating module 30 performs a coating process and a developing process on the substrates W. The treating module 30 has the coating blocks 30a and the developing blocks 30b. The coating blocks 30a perform the coating process on the substrates W, and the developing blocks 30b perform the developing process on the substrates W. The coating blocks 30a are stacked on each other. The developing blocks 30b are stacked on each other. According to the embodiment of FIG. 3, two coating blocks 30a and two developing block 30b are provided. The coating blocks 30a may be disposed under the developing blocks 30b. According to an embodiment, the two coating blocks 30a may perform the same process and may have the same structure. Furthermore, the two developing blocks 30b may perform the same process and may have the same structure.

Referring to FIG. 5, the coating blocks 30a have heat treatment chambers 3200, a transfer chamber 3400, liquid treating chambers 3600, and buffer chambers 3800. The heat treatment chambers 3200 perform a heat treatment process on the substrates W. The heat treatment process may include a cooling process and a heating process. The liquid treating chambers 3600 form a liquid film on the substrate W by dispensing a liquid onto the substrate W. The liquid film may be a photoresist film or an anti-reflection film. The transfer chamber 3400 transfers the substrates W between the heat treatment chambers 3200 and the liquid treating chambers 3600 in the coating blocks 30a.

The lengthwise direction of the transfer chamber 3400 is parallel to the first direction 12. A transfer robot 3422 is provided in the transfer chamber 3400. The transfer robot 3422 transfers the substrates W between the heat treatment chambers 3200, the liquid treating chambers 3600, and the buffer chambers 3800. According to an embodiment, the transfer robot 3422 has a hand 3420 on which the substrate W is placed, and the hand 3420 is movable forward and backward, rotatable about an axis oriented in the third direction 16, and movable along the third direction 16. A guide rail 3300, the lengthwise direction of which is parallel to the first direction 12, is provided in the transfer chamber 3400, and the transfer robot 3422 is movable on the guide rail 3300.

Figure 6:
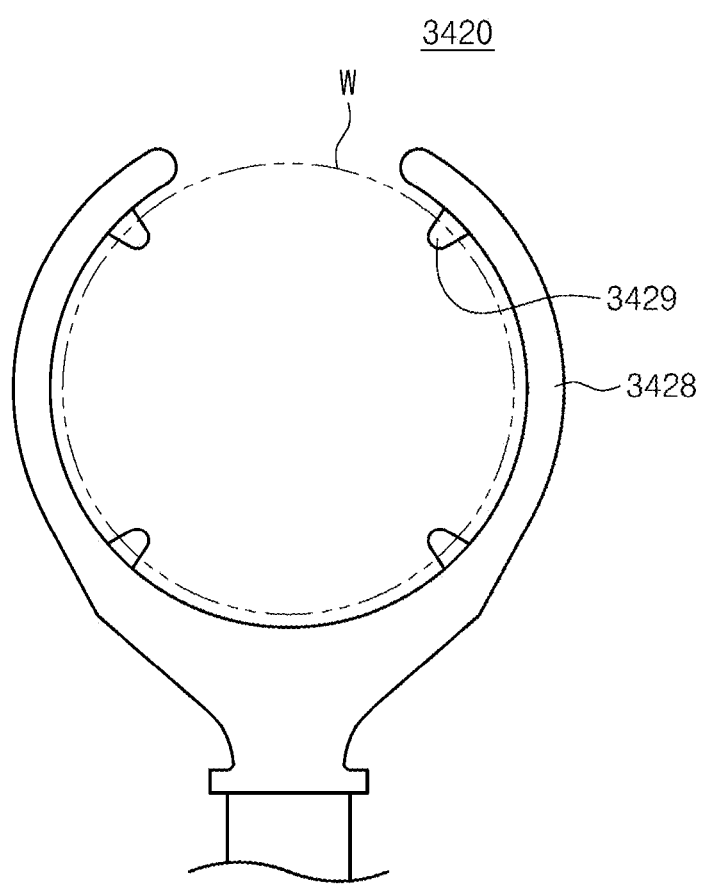
FIG. 6 is a view illustrating one example of a hand of a transfer robot of FIG. 5.

FIG. 6 is a view illustrating one example of the hand of the transfer robot of FIG. 5. Referring to FIG. 6, the hand 3420 has a base 3428 and support protrusions 3429. The base 3428 may have an annular ring shape, the circumference of which is partly curved. The base 3428 has an inner diameter larger than the diameter of the substrate W. The support protrusions 3429 extend inward from the base 3428. The support protrusions 3429 support an edge area of the substrate W. According to an embodiment, four support protrusions 3429 may be provided at equal intervals.

The heat treatment chambers 3200 are arranged along the first direction 12. The heat treatment chambers 3200 are located on one side of the transfer chamber 3400.

Figure 7:
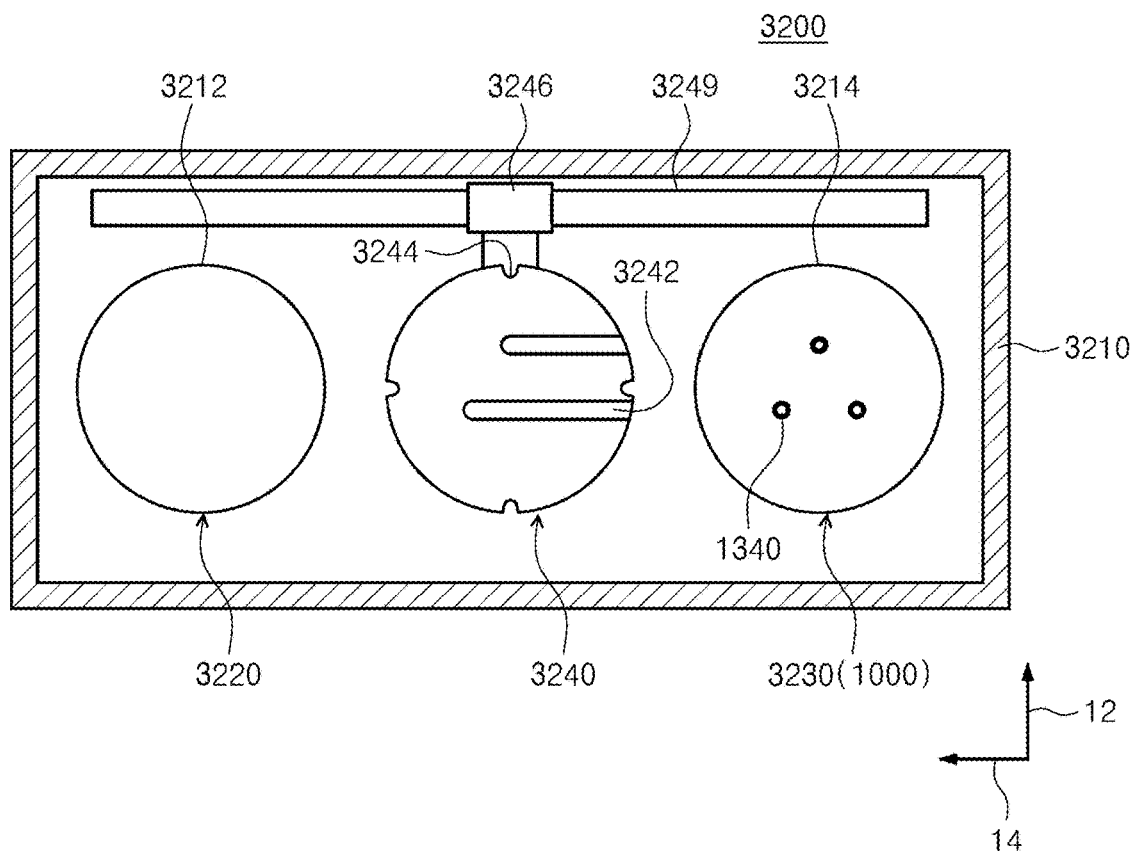
FIG. 7 is a schematic plan view illustrating one example of heat treatment chambers of FIG. 5.
Figure 8:
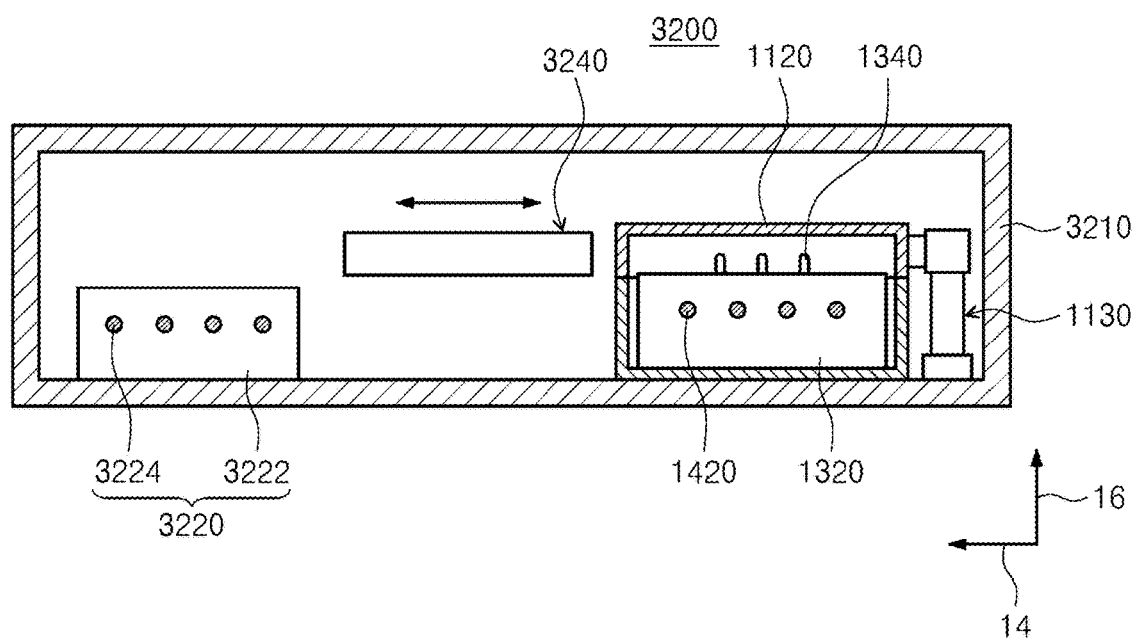
FIG. 8 is a front view of the heat treatment chamber of FIG. 7.

FIG. 7 is a schematic plan view illustrating one example of the heat treatment chambers of FIG. 5, and FIG. 8 is a front view of the heat treatment chamber of FIG. 7. Referring to FIGS. 7 and 8, the heat treatment chamber 3200 has a housing 3210, a cooling unit 3220, a heating unit 3230, and a transfer plate 3240.

The housing 3210 has a substantially rectangular parallelepiped shape. The housing 3210 has, in a sidewall thereof, an entrance/exit opening (not illustrated) through which the substrate W enters and exits the housing 3210. The entrance/exit opening may be maintained in an open state. Selectively, a door (not illustrated) may be provided to open and close the entrance/exit opening. The cooling unit 3220, the heating unit 3230, and the transfer plate 3240 are provided in the housing 3210. The cooling unit 3220 and the heating unit 3230 are provided side by side along the second direction 14. According to an embodiment, the cooling unit 3220 may be located closer to the transfer chamber 3400 than the heating unit 3230.

The cooling unit 3220 has a cooling plate 3222. The cooling plate 3222 may have a substantially circular shape when viewed from above. A cooling member 3224 is provided inside the cooling plate 3222. According to an embodiment, the cooling member 3224 may be formed inside the cooling plate 3222 and may serve as a fluid channel through which a cooling fluid flows.

Figure 9:
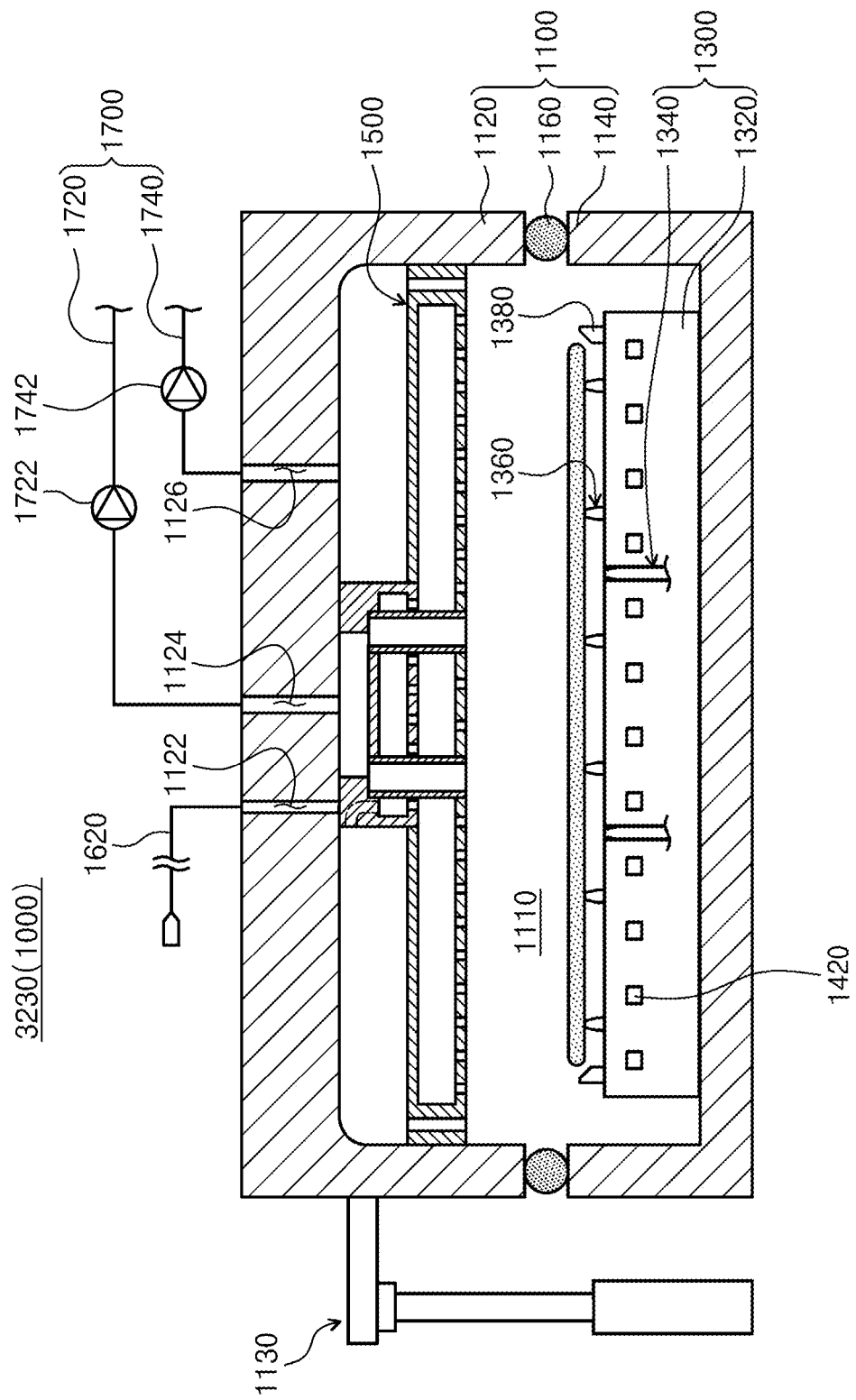
FIG. 9 is a sectional view illustrating a heating unit of FIG. 8.

The heating unit 3230 is implemented with an apparatus 1000 that heats the substrate W to a temperature higher than the room temperature. The heating unit 3230 performs heat treatment on the substrate W in an atmospheric atmosphere or in an atmosphere of reduced pressure lower than the atmospheric pressure. FIG. 9 is a sectional view illustrating the heating unit of FIG. 8. Referring to FIG. 9, the heating unit 3230 includes a chamber 1100, a substrate support unit 1300, a heater unit 1420, a gas flow generation unit 1500, a gas supply unit 1620, and a gas exhaust unit 1700.

The chamber 1100 has a treating space 1110 therein in which heat treatment is performed on the substrate W. The treating space 1110 is sealed from the outside. The chamber 1100 includes an upper body 1120, a lower body 1140, and a sealing member 1160.

The upper body 1120 has the shape of a container that is open at the bottom. The upper body 1120 has an inflow hole 1122, a first outflow hole 1124, and a second outflow hole 1126 formed in a top side thereof. The first outflow hole 1124 is located in a central area of the upper body 1120, and the second outflow hole 1126 is located outside the central area of the upper body 1120. The outflow holes 1124 and 1126 are connected to the gas exhaust unit 1700 to evacuate the treating space 1110. The inflow hole 1122 functions as a passage through which external air is introduced into the treating space 1110. The gas supply unit 1620 is connected to the inflow hole 1122. According to an embodiment, the external air may be clean air.

The lower body 1140 has the shape of a container that is open at the top. The lower body 1140 is located under the upper body 1120. The upper body 1120 and the lower body 1140 are located to face each other in the vertical direction. The upper body 1120 and the lower body 1140 are combined with each other to form the treating space 1110 inside. The upper body 1120 and the lower body 1140 are located such that the central axes thereof are aligned with each other in the vertical direction. The lower body 1140 may have the same diameter as the upper body 1120. That is, an upper end of the lower body 1140 may be located to face a lower end of the upper body 1120.

One of the upper body 1120 and the lower body 1140 is moved to an open position or a closed position by a lifting member 1130, and the other is fixed in position. In this embodiment, it is exemplified that the lower body 1140 is fixed in position and the upper body 1120 is moved. The open position is a position in which the upper body 1120 and the lower body 1140 are spaced apart from each other and therefore the treating space 1110 is open. The closed position is a position in which the treating space 1110 is sealed from the outside by the lower body 1140 and the upper body 1120.

The sealing member 1160 is located between the upper body 1120 and the lower body 1140. The sealing member 160 seals the treating space 1110 from the outside when the upper body 1120 and the lower body 1140 are brought into contact with each other. The sealing member 1160 may have an annular ring shape. The sealing member 1160 may be fixedly coupled to the upper end of the lower body 1140.

Figure 10:
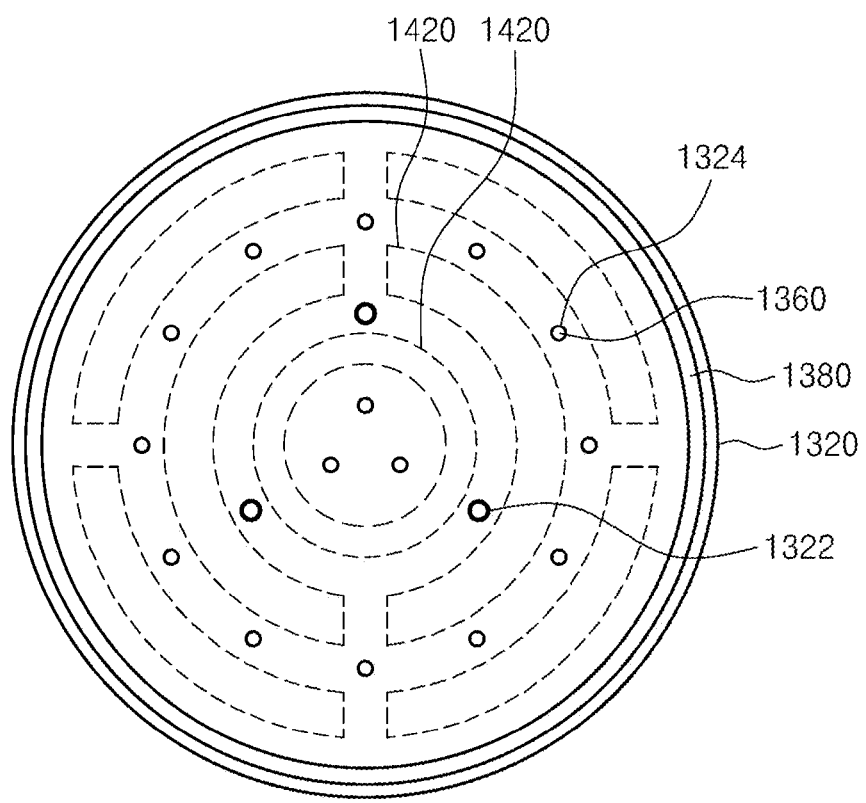
FIG. 10 is a plan view illustrating a support plate of FIG. 9.

The substrate support unit 1300 supports the substrate W in the treating space 1110. The substrate support unit 1300 is fixedly coupled to the lower body 1140. The substrate support unit 1300 includes a support plate 1320, lift pins 1340, and support pins 1360. FIG. 10 is a plan view illustrating the support plate of FIG. 9. Referring to FIGS. 9 and 10, the support plate 1320 transfers, to the substrate W, heat generated from the heater unit 1420. The support plate 1320 has a circular plate shape. An upper surface of the support plate 1320 has a larger diameter than the substrate W. The upper surface of the support plate 1320 functions as a seating surface over which the substrate W is placed. A plurality of lift holes 1322, insertion holes 1324, and vacuum holes (not illustrated) are formed in the seating surface. The lift holes 1322, the insertion holes 1324, and the vacuum holes (not illustrated) are located in different areas. The lift holes 1322 and the vacuum holes (not illustrated), when viewed from above, are arranged to surround the center of the upper surface of the support plate 1320. The lift holes 1322 are arranged to be spaced apart from each other along the circumferential direction. The vacuum holes (not illustrated) may provide negative pressure between the seating surface and the substrate W to clamp the substrate W by the vacuum pressure. The lift holes 1322 may be located to be spaced apart from each other at equal intervals. The insertion holes 1324 are arranged differently from the lift holes 1322 and the vacuum holes (not illustrated). The insertion holes 1324 may be evenly arranged in the entire area of the seating surface.

For example, three lift holes 1322 and three vacuum holes (not illustrated) may be provided. The support plate 1320 may be formed of a material containing aluminum nitride (AlN).

The lift pins 1340 raise or lower the substrate W over the support plate 1320. The lift pins 1340 have a pin shape facing the vertical direction. The lift pins 1340 are located in the lift holes 1322, respectively. The drive member (not illustrated) moves the lift pins 1340 between a raised position and a lowered position. Here, the raised position is defined as a position in which upper ends of the lift pins 1340 are in a higher position than the seating surface, and the lowered position is defined as a position in which the upper ends of the lift pins 1340 are at the same height as, or in a lower position than, the seating surface. The drive member (not illustrated) may be located outside the chamber 1100. The drive member (not illustrated) may be a cylinder.

The support pins 1360 prevent the substrate W from making direct contact with the seating surface. The support pins 1360 have a pin shape having a lengthwise direction parallel to the lift pins 1340. The support pins 1360 are fixed to the seating surface. The support pins 1360 are located to protrude upward from the seating surface. Upper ends of the support pins 1360 are provided as contact surfaces making direct contact with the backside of the substrate W, and the contact surfaces have a shape that is convex upward. Accordingly, contact areas between the support pins 1360 and the substrate W may be minimized.

A guide 1380 guides the substrate W to locate the substrate W in a correct position over the seating surface. The guide 1380 has an annular ring shape that surrounds the seating surface. The guide 1380 has a larger diameter than the substrate W. An inside surface of the guide 1380 has a shape downwardly inclined with an approach to the central axis of the support plate 1320. Accordingly, the substrate W supported on the inside surface of the guide 1380 is moved to the correct position along the inclined surface. Furthermore, the guide 1380 may slightly prevent a gas flow introduced between the substrate W and the seating surface.

The heater unit 1420 performs heat treatment on the substrate W placed over the support plate 1320. The heater unit 1420 is located below the substrate W placed over the support plate 1320. The heater unit 1420 includes a plurality of heaters 1420. The heaters 1420 are located inside the support plate 1320. Selectively, the heaters 1420 may be located on the bottom of the support plate 1320. The heaters 1420 are located on the same plane. According to an embodiment, the heaters 420 may heat different areas of the seating surface to different temperatures. Some of the heaters 1420 may heat a central area of the seating surface to a first temperature, and the other heaters 1420 may heat an edge area of the seating surface to a second temperature. The second temperature may be higher than the first temperature. The heaters 1420 may be printed patterns or heating wires.

Figure 11:
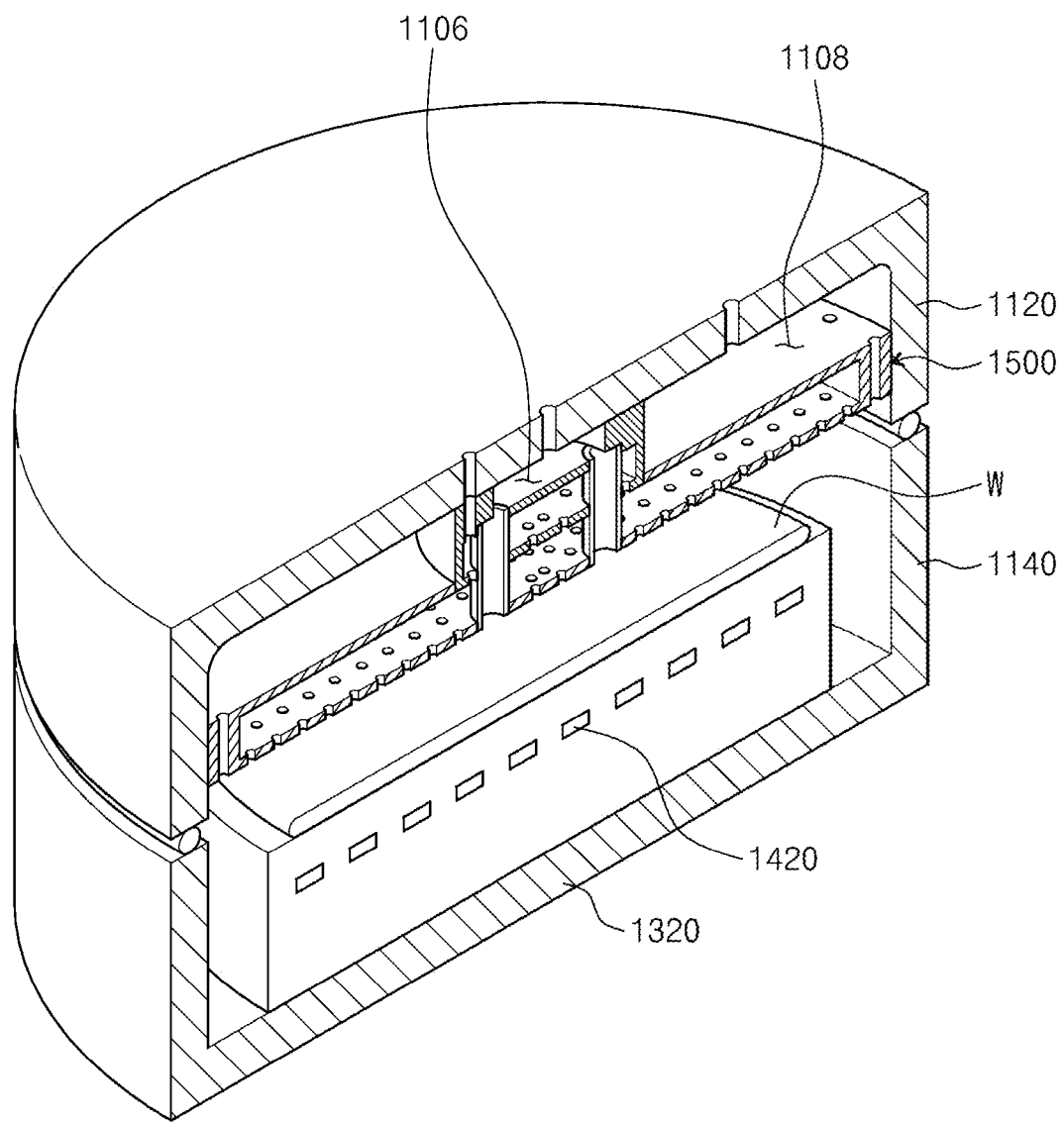
FIG. 11 is a sectional perspective view illustrating a gas flow generation unit of FIG. 9.
Figure 12:
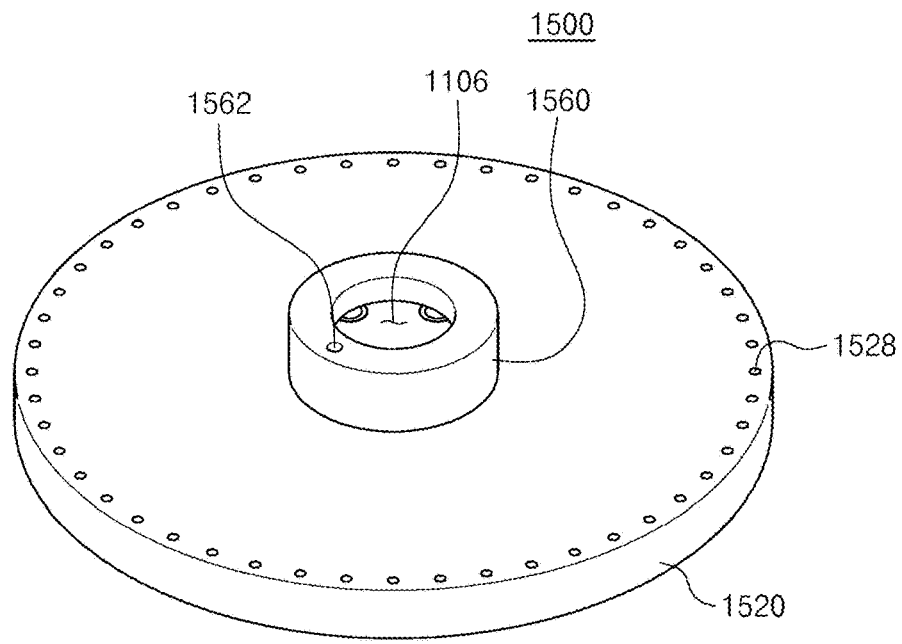
FIG. 12 is a perspective view illustrating the gas flow generation unit of FIG. 9.
Figure 13:
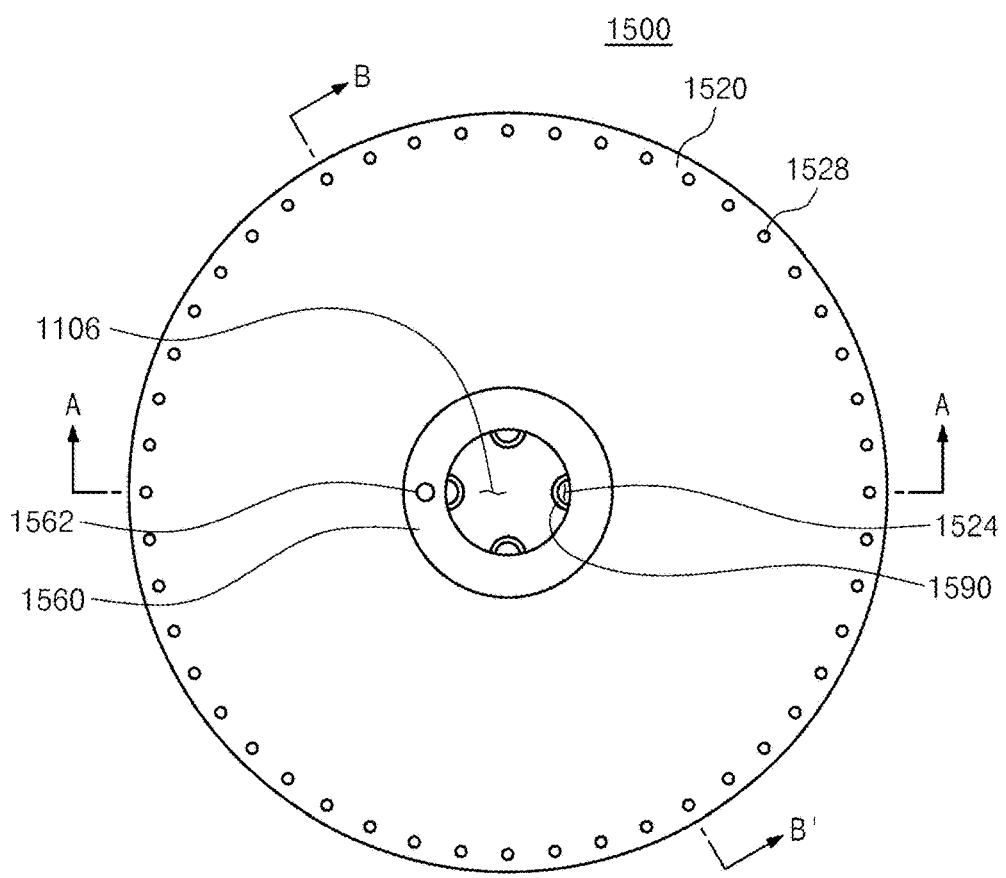
FIG. 13 is a plan view of the gas flow generation unit of FIG. 12.
Figure 14:
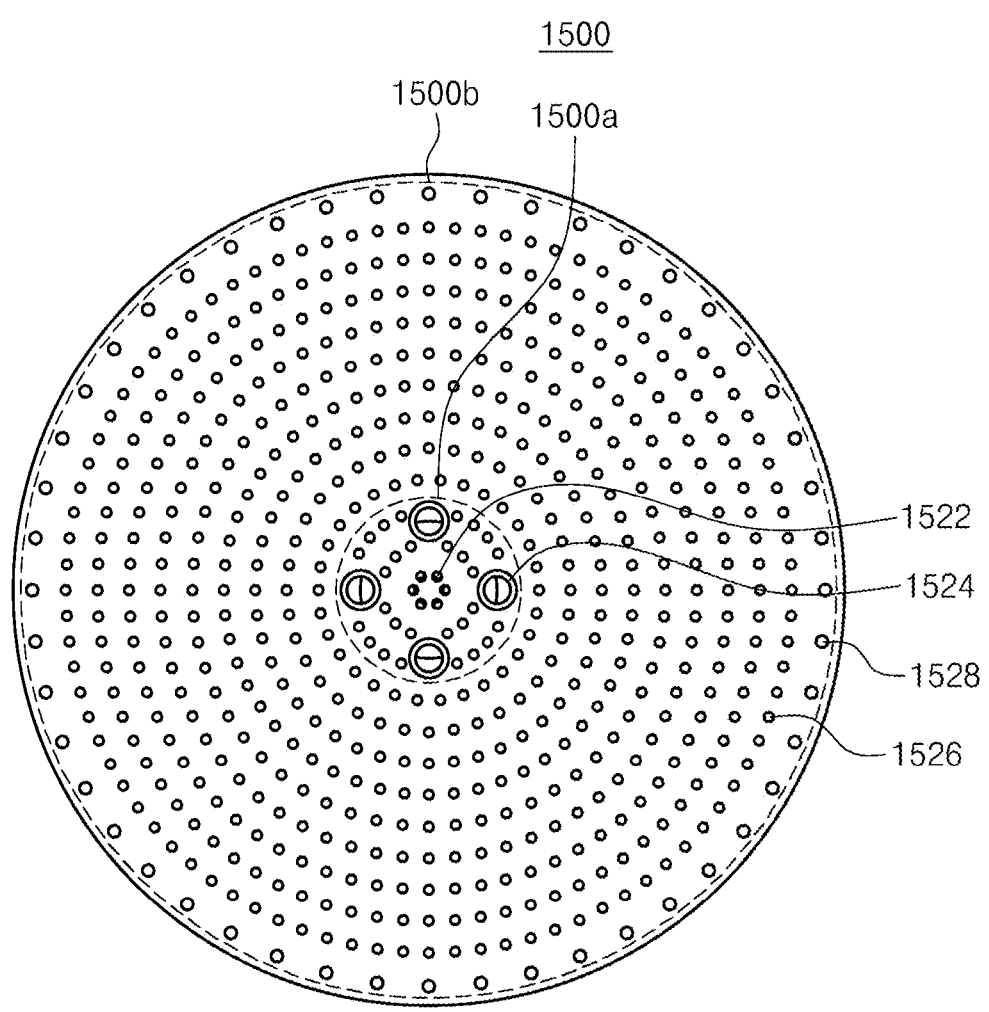
FIG. 14 is a bottom view of the gas flow generation unit of FIG. 12.
Figure 15:
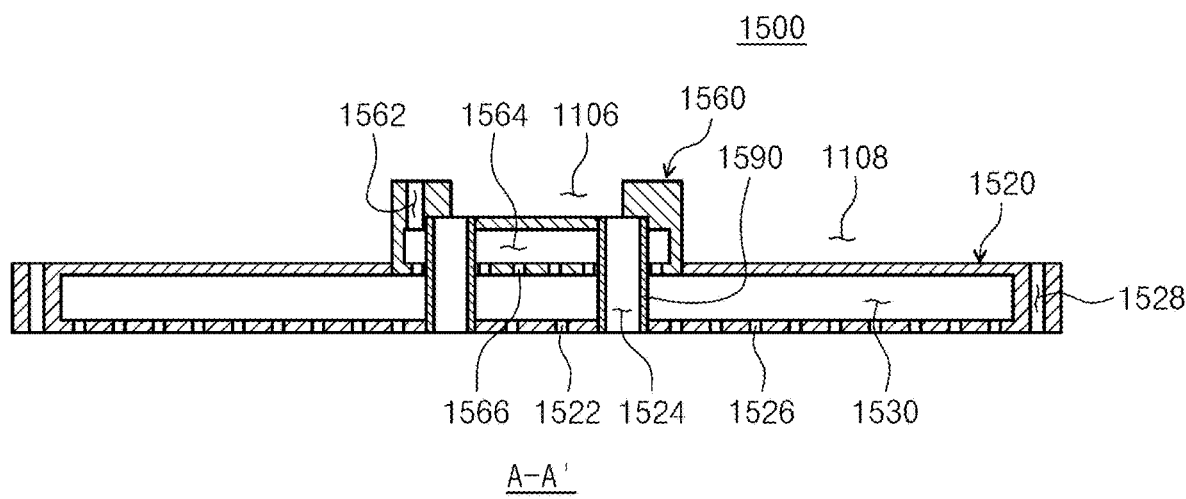
FIG. 15 is a sectional view of the gas flow generation unit taken along line A-A' of FIG. 13.
Figure 16:
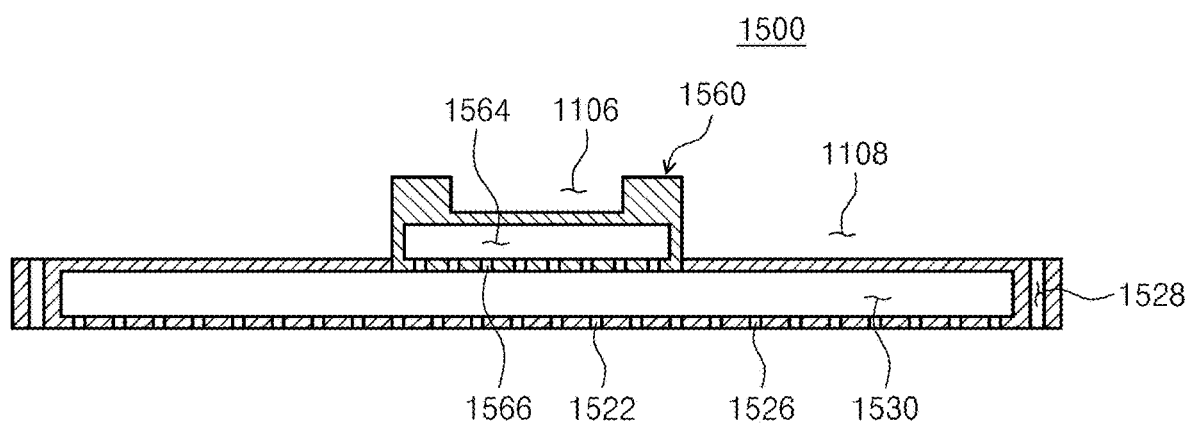
FIG. 16 is a sectional view of the gas flow generation unit taken along line B-B' of FIG. 13.

The gas flow generation unit 1500 adjusts a gas flow in the treating space 1110. The gas flow generation unit 1500 adjusts the gas flow in the treating space 1110 such that the gas flow has a uniform flow rate for each area. FIGS. 11 to 16 are views illustrating the gas flow generation unit at various angles. FIG. 11 is a sectional perspective view of the gas flow generation unit. FIG. 12 is a perspective view of the gas flow generation unit. FIG. 13 is a plan view of the gas flow generation unit. FIG. 14 is a bottom view of the gas flow generation unit. FIG. 15 is a sectional view of the gas flow generation unit taken along line A-A' of FIG. 13. FIG. 16 is a sectional view of the gas flow generation unit taken along line B-B' of FIG. 13. Referring to FIGS. 11 to 16, the gas flow generation unit 1500 includes a plate 1520, an intermediate body 1560, and exhaust tubes 1590. The plate 1520 is located to face the substrate W placed on the substrate support unit 1300 in the treating space 1110. The plate 1520 is located over the substrate W. For example, the plate 1520 may have a circular plate shape. The plate 1520 may have a diameter that is the same as the inner diameter of the chamber 1100. Accordingly, the interior space of the chamber 1100 may be divided into the lower space 1110 under the plate 1520 and an upper space over the plate 1520. Here, the space in which the substrate W is treated may correspond to the lower space 1110 under the plate 1520.

A plurality of holes 1522, 1524, 1526, and 1528 are formed in the bottom of the plate 1520 that faces the substrate W. The holes 1522, 1524, 1526, and 1528 performing different functions are formed in respective areas of the bottom of the plate 1520. The supply holes 1522 and 1526 and the exhaust holes 1524 and 1528 are formed in the bottom of the plate 1520. The supply holes 1522 and 1526 function as holes for dispensing gas, and the exhaust holes 1524 and 1528 function as holes for evacuating the space between the plate 1520 and the substrate support unit 1300.

The first supply holes 1522 and the first exhaust holes 1524 are formed in a first area 1500*a* of the bottom of the plate 1520, and the second supply holes 1526 and the second exhaust holes 1528 are formed in a second area 1500*b* of the bottom of the plate 1520. The first area 1500*a* is an area containing the center of the plate 1520, and the second area 1500*b* is a ring-shaped area surrounding the first area 1500*a*. The first supply holes 1522 are arranged in a region containing the center of the first area 1550*a*, and the first exhaust holes 1524 are arranged in a ring shape surrounding the first supply holes 1522. The first exhaust holes 1524 may be located to be spaced apart from each other at constant intervals. For example, the number of first exhaust holes 1524 may be fewer than the number of first supply holes 1522. Four first exhaust holes 1524 may be provided. The first exhaust holes 1524 may have a larger diameter than the first supply holes 1522. Due to this, the density of the gas dispensed onto the substrate W through the first supply holes 1522 may be raised, and a flow path of the gas through the first exhaust holes 1524 may be easily adjusted.

Some of the first exhaust holes 1524 may be located farther away from the center of the plate 1520 than the first supply holes 1522, and the other first exhaust holes 1524 may be located at the same distance as the first supply holes 1522.

The second supply holes 1526 are arranged to surround the first exhaust holes 1524, and the second exhaust holes 1528 are arranged to surround the second supply holes 1526. That is, the second supply holes 1526 are located closer to the center of the plate 1520 than the second exhaust holes 1528. The first supply holes 1522, the second supply holes 1526, the first exhaust holes 1524, and the second exhaust holes 1528 may have a circular shape.

A diffusion space 1530 connected to the first supply holes 1522 and the second supply holes 1526 is formed inside the plate 1520. The diffusion space 1530 is a space in which the gas is spread so as to be uniformly supplied into the first supply holes 1522 and the second supply holes 1526.

The second exhaust holes 1528 are located outside the diffusion space 1530. The second exhaust holes 1528 extend from the bottom to the top of the plate 1520.

The intermediate body 1560 connects the chamber 1100 and the plate 1520. The intermediate body 1560 is located between the ceiling of the chamber 1100 and the plate 1520. The top of the intermediate body 1560 is coupled to the ceiling of the chamber 1100, and the bottom of the intermediate body 1560 is coupled to the plate 1520. The intermediate body 1560 has a cylindrical shape with a recess formed on the top. A central area of the top of the intermediate body 1560 is in a lower position than an edge area thereof. The intermediate body 1560 is coupled to the ceiling of the chamber 1100 such that the central area of the top of the intermediate body 1560 faces the first outflow hole 1124. Accordingly, the top of the intermediate body 1560 and the ceiling of the chamber 1100 are combined with each other to form a first exhaust space 1106.

The gas exhausted through the second exhaust holes 1528 is exhausted into a second exhaust space 1108 formed by a combination of an inner surface of the chamber 1100, the plate 1520, and an outer surface of the intermediate body 1560. The second exhaust space 1108 is located to be connected to the second outflow hole 1126.

An introduction hole 1562 is formed in an edge area of the top of the intermediate body 1560, and a buffer space 1564 is formed inside the intermediate body 1560. The introduction hole 1562 extends downward and connects to the buffer space 1564. The intermediate body 1560 is located such that the introduction hole 1562 faces the inflow hole 1122. Accordingly, external air introduced through the inflow hole 1122 is supplied into the buffer space 1564 through the introduction hole 1562. The buffer space 1564 is a space for firstly spreading the gas. The intermediate body 1560 is coupled to the plate 1520 such that the buffer space 1564 covers the first supply holes 1522 when viewed from above. Buffer holes 1566 are formed in the bottom of the intermediate body 1560 to connect the buffer space 1564 and the diffusion space 1530. When viewed from above, the buffer holes 1566 are located so as not to overlap the first supply holes 1522. Due to this, the gas passing through the buffer holes 1566 may collide with the plate 1520 to secondly spread in the diffusion space 1530.

The exhaust tubes 1590 separate the first exhaust holes 1524 from the diffusion space 1530 and the buffer space 1564. The same number of exhaust tubes 1590 as the first exhaust holes 1524 are provided. For example, four exhaust tubes 1590 may be provided. The exhaust tubes 1590 have a length extending from the bottom of the plate 1520 to the recess of the intermediate body 1560. The exhaust tubes 1590 are located to be aligned with the first exhaust holes 1524 when viewed from above. The exhaust tubes 1590 are inserted into the first exhaust holes 1524 to pass through the diffusion space 1530 and the buffer space 1564. Lower ends of the exhaust tubes 1590 are located at the same height as the first exhaust holes 1524, and upper ends of the exhaust tubes 1590 are located at the height corresponding to the first exhaust space 1106. The exhaust tubes 1590 are located to overlap the first exhaust holes 1106 when viewed from above. That is, the opening ratio at the upper ends of the exhaust tubes 1590 may be smaller than the opening ratio at the lower ends of the exhaust tubes 1590. This may allow gas flows exhausted through the exhaust tubes 1590 to be guided toward the center of the first exhaust space 1106.

The gas supply unit 1620 includes the gas supply line 1620 connected to the inflow hole 1122. The gas supply line 1620 supplies the gas into the inflow hole 1122. The gas supplied into the inflow hole 1122 may be supplied to the first supply holes 1522 and the second supply holes 1526 via the introduction hole 1562, the buffer space 1564, the buffer holes 1566, and the diffusion space 1530. A filter may be installed in the gas supply line 1620 and may remove particles contained in the gas.

The gas exhaust unit 1700 includes a first exhaust line 1720 and a second exhaust line 1740. The first exhaust line 1720 is connected to the first outflow hole 1124 to evacuate the first exhaust space 1106, and the second exhaust line 1740 is connected to the second outflow hole 1126 to evacuate the second exhaust space 1108. A first pressure-reducing member 1722 is connected to the first exhaust line 1720, and a second pressure-reducing member 1742 is connected to the second exhaust line 1740. The pressure-reducing members 1722 and 1742 are able to be independently controlled. According to an embodiment, a controller (not illustrated) may control the pressure-reducing members 1722 and 1742 to reduce the pressures in the first exhaust space 1106 and the second exhaust space 1108 to different pressures.

Figure 17:
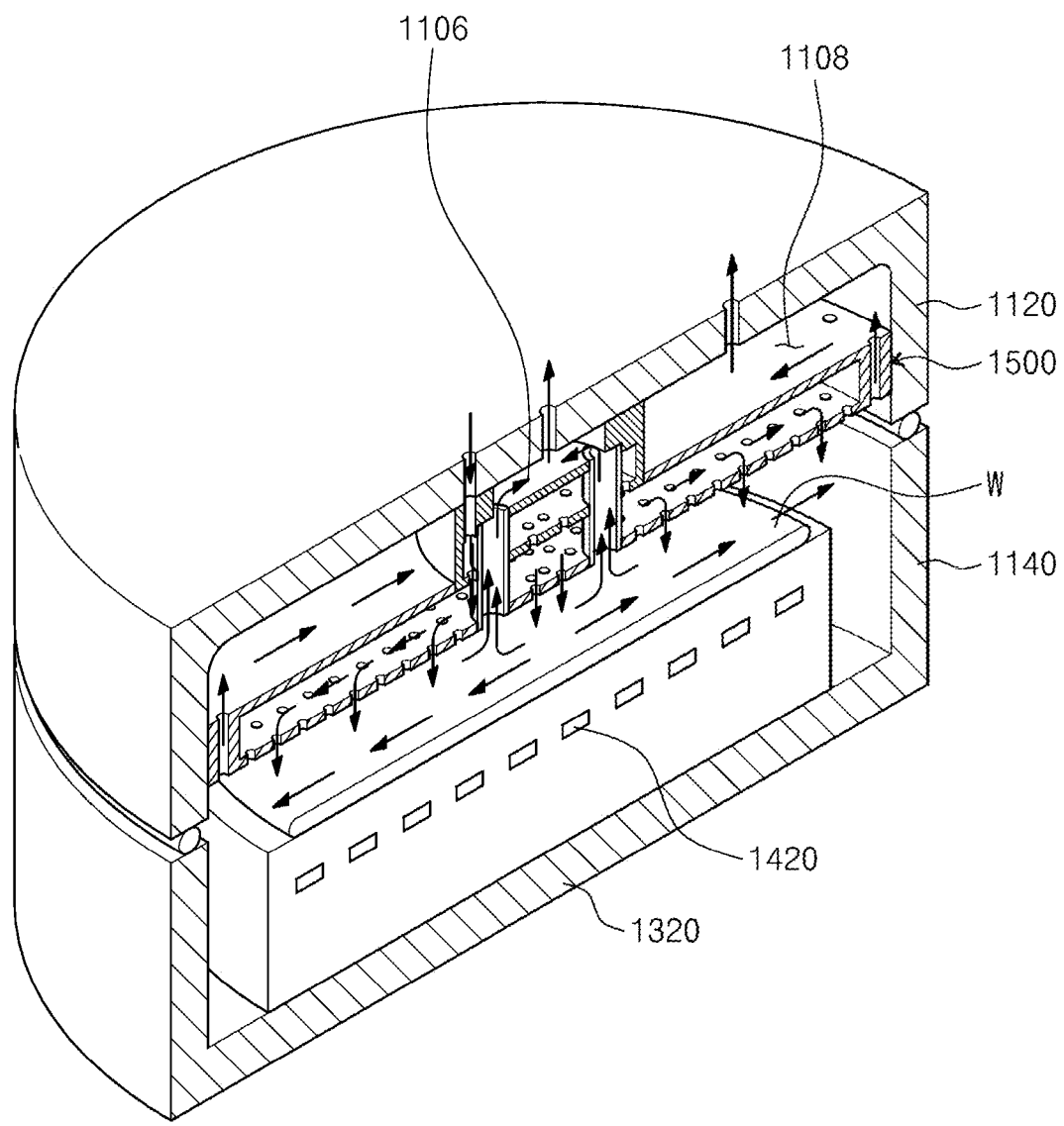
FIG. 17 is a view illustrating a gas flow in the gas flow generation unit of FIG. 11.
Figure 18:
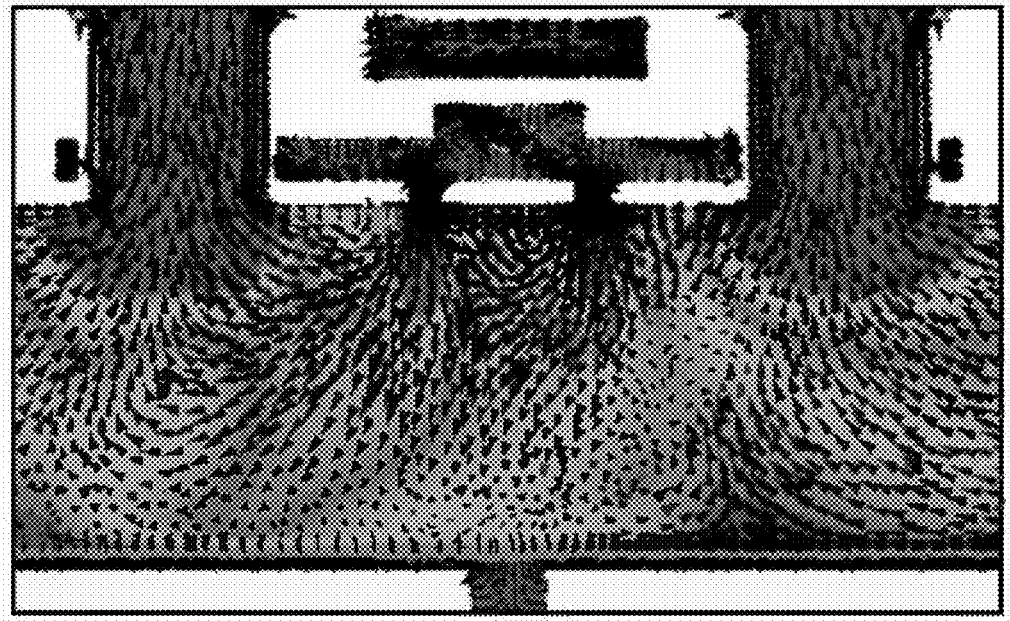
FIG. 18 illustrates data showing a gas flow in the gas flow generation unit of FIG. 15.
Figure 19:
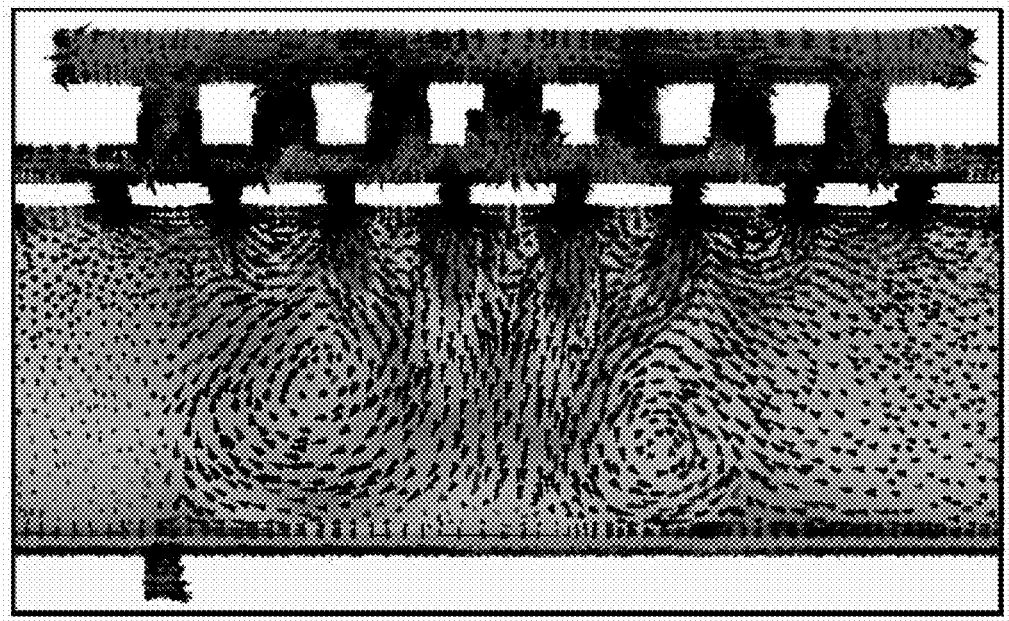
FIG. 19 illustrates data showing a gas flow in the gas flow generation unit of FIG. 16.

Next, a gas flow in the above-described substrate treating apparatus will be described in more detail. FIG. 17 is a view illustrating a gas flow in the gas flow generation unit of FIG. 11. FIG. 18 illustrates data showing a gas flow in the gas flow generation unit of FIG. 15. FIG. 19 illustrates data showing a gas flow in the gas flow generation unit of FIG. 16. Referring to FIGS. 17 to 19, the gas sequentially passes through the inflow hole 1122, the introduction hole 1562, the buffer space 1564, the buffer holes 1566, and the diffusion space 1530 and is delivered to the first supply holes 1522 or the second supply holes 1526. The gas dispensed from the first supply holes 1522 is supplied to the central area of the substrate W, and the gas dispensed from the second supply holes 1526 is supplied to the edge area of the substrate W. The buffer space 1564 and the buffer holes 1566 are located to face the first supply holes 1522 and are located closer to the first supply holes 1522 rather than the second supply holes 1526. Due to this, the gas (hereinafter, referred to as the first gas) that is dispensed through the first supply holes 1522 may be dispensed at a higher flow rate than the gas (hereinafter, referred to as the second gas) that is dispensed through the second supply holes 1526. In general, the edge area of the substrate W has a lower temperature than the central area of the substrate W. Therefore, the temperature of the entire area of the substrate W may be uniformly adjusted by making the flow rate of the first gas higher than the flow rate of the second gas. Furthermore, the temperatures of the respective areas of the substrate W may be adjusted by controlling the first pressure-reducing member 1722 connected to the first outflow hole 1124 and the second pressure-reducing member 1742 connected to the second outflow hole 1126.

The gas dispensed through the first supply holes 1522 is uniformly exhausted through the first exhaust holes 1524. Part of the gas dispensed through the second supply holes 1526 is exhausted through the first exhaust holes 1524, and the rest is exhausted through the second exhaust holes 1528.

Due to this, the gas flow in the treating space 1110 may be prevented from being focused on the central area of the substrate W.

Referring again to FIGS. 7 and 8, the transfer plate 3240 has a substantially circular plate shape and has a diameter corresponding to the substrate W. The transfer plate 3240 has notches 3244 formed at the edge thereof. The notches 3244 may have a shape corresponding to the protrusions 3429 formed on the hand 3420 of the transfer robot 3422 described above. Furthermore, as many notches 3244 as the protrusions 3429 formed on the hand 3420 are formed in positions corresponding to the protrusions 3429. The substrate W is transferred between the hand 3420 and the transfer plate 3240 when the vertical positions of the hand 3420 and the transfer plate 3240 aligned with each other in the vertical direction are changed. The transfer plate 3240 may be mounted on a guide rail 3249 and may be moved between a first area 3212 and a second area 3214 along the guide rail 3249 by an actuator 3246. A plurality of guide grooves 3242 in a slit shape are formed in the transfer plate 3240. The guide grooves 3242 extend inward from the edge of the transfer plate 3240. The lengthwise direction of the guide grooves 3242 is parallel to the second direction 14, and the guide grooves 3242 are spaced apart from each other along the first direction 12. The guide grooves 3242 prevent the transfer plate 3240 and the lift pins 1340 from interfering with each other when the substrate W is transferred between the transfer plate 3240 and the heating unit 3230.

The substrate W is heated in a state of being directly placed on the support plate 1320. The substrate W is cooled in a state in which the transfer plate 3240 on which the substrate W is placed is brought into contact with the cooling plate 3222. For efficient heat transfer between the cooling plate 3222 and the substrate W, the transfer plate 3240 is formed of a material having a high heat transfer rate. According to an embodiment, the transfer plate 3240 may be formed of a metallic material.

The heating units 3230 provided in some of the heat treatment chambers 3200 may improve adhesion of photoresist to the substrate W by supplying gas while heating the substrate W. According to an embodiment, the gas may be a hexamethyldisilane gas.

The plurality of liquid treating chambers 3600 are provided. Some of the liquid treating chambers 3600 may be stacked on each other. The liquid treating chambers 3600 are disposed on an opposite side of the transfer chamber 3400. The liquid treating chambers 3600 are arranged side by side along the first direction 12. Some of the liquid treating chambers 3600 are located adjacent to the index module 20. Hereinafter, these liquid treating chambers are referred to as the front liquid treating chambers 3602. Other liquid treating chambers 3600 are located adjacent to the interface module 40. Hereinafter, these liquid treating chambers are referred to as the rear liquid treating chambers 3604.

The front liquid treating chambers 3602 apply a first liquid to the substrate W, and the rear liquid treating chambers 3604 apply a second liquid to the substrate W. The first liquid and the second liquid may be different types of liquids. According to an embodiment, the first liquid is an anti-reflection film, and the second liquid is photoresist. The photoresist may be applied to the substrate W coated with the anti-reflection film. Selectively, the first liquid may be photoresist, and the second liquid may be an anti-reflection film. In this case, the anti-reflection film may be applied to the substrate W coated with the photoresist. Selectively, the first liquid and the second liquid may be of the same type. Both the first liquid and the second liquid may be photoresist.

Figure 20:
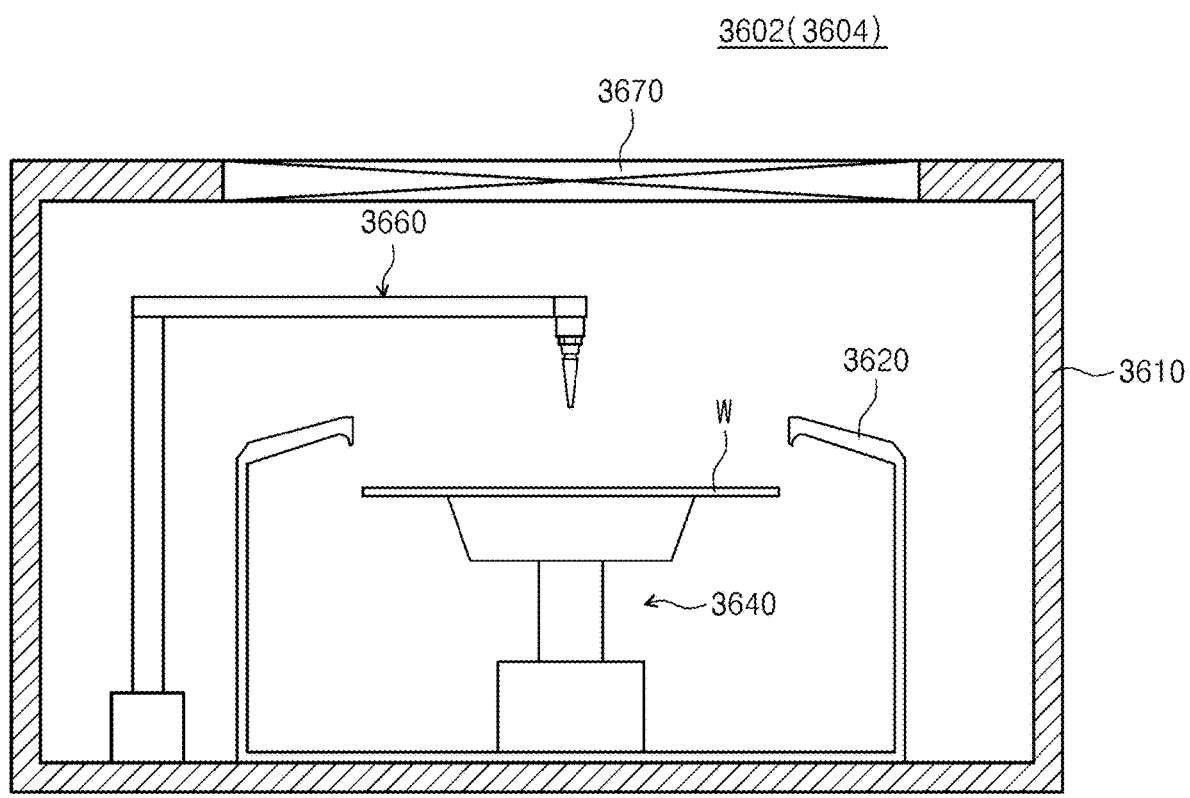
FIG. 20 is a schematic view illustrating one example of liquid treating chambers of FIG. 5.

FIG. 20 is a schematic view illustrating one example of the liquid treating chambers of FIG. 5. Referring to FIG. 20, the liquid treating chambers 3602 and 3604 have a housing 3610, a cup 3620, a support unit 3640, and a liquid dispensing unit 3660. The housing 3610 has a substantially rectangular parallelepiped shape. The housing 3610 has, in a sidewall thereof, an entrance/exit opening (not illustrated) through which the substrate W is loaded into or unloaded from the housing 3610. The entrance/exit opening may be opened and closed by a door (not illustrated). The cup 3620, the support unit 3640, and the liquid dispensing unit 3660 are provided in the housing 3610. A fan filter unit 3670 for forming a downward flow of air in the housing 3610 may be provided in an upper wall of the housing 3610. The cup 3620 has a treating space that is open at the top. The support unit 3640 is disposed in the treating space and supports the substrate W. The support unit 3640 is provided such that the substrate W is rotatable during liquid treatment. The liquid dispensing unit 3660 dispenses a liquid onto the substrate W supported on the support unit 3640.

Referring again to FIGS. 4 and 5, the plurality of buffer chambers 3800 are provided. Some of the buffer chambers 3800 are disposed between the index module 20 and the transfer chamber 3400. Hereinafter, these buffer chambers are referred to as the front buffers 3802. The front buffers 3802 are stacked one above another along the vertical direction. The other buffer chambers 3800 are disposed between the transfer chamber 3400 and the interface module 40. These buffer chambers are referred to as the rear buffers 3804. The rear buffers 3804 are stacked one above another along the vertical direction. The front buffers 3802 and the rear buffers 3804 temporarily store a plurality of substrates W. The substrates W stored in the front buffers 3802 are extracted by the index robot 2200 and the transfer robot 3422. The substrates W stored in the rear buffers 3804 are extracted by the transfer robot 3422 and a first robot 4602.

The developing blocks 30b have heat treatment chambers 3200, a transfer chamber 3400, and liquid treating chambers 3600. The heat treatment chambers 3200, the transfer chamber 3400, and the liquid treating chambers 3600 of the developing blocks 30b are disposed in a structure substantially similar to the structure in which the heat treatment chambers 3200, the transfer chamber 3400, and the liquid treating chambers 3600 of the coating blocks 30a are disposed. However, the liquid treating chambers 3600 in the developing blocks 30b are provided as developing chambers 3600, all of which identically dispense a developing solution to develop a substrate.

The interface module 40 connects the treating module 30 with an external stepper 50. The interface module 40 has an interface frame 4100, an additional process chamber 4200, an interface buffer 4400, and a transfer member 4600.

The interface frame 4100 may have, at the top thereof, a fan filter unit that forms a downward flow of air in the interface frame 4100. The additional process chamber 4200, the interface buffer 4400, and the transfer member 4600 are disposed inside the interface frame 4100. Before the substrate W completely treated in the coating blocks 30a is transferred to the stepper 50, the additional process chamber 4200 may perform a predetermined additional process on the substrate W. Selectively, before the substrate W completely treated in the stepper 50 is transferred to the developing blocks 30b, the additional process chamber 4200 may perform a predetermined additional process on the substrate W.

According to an embodiment, the additional processes may be an edge exposing process of exposing the edge area of the substrate W to light, a top-side cleaning process of cleaning the top side of the substrate W, or a back-side cleaning process of cleaning the backside of the substrate W. A plurality of additional process chambers 4200 may be provided. The additional process chambers 4200 may be stacked one above another. The additional process chambers 4200 may all perform the same process. Selectively, some of the additional process chambers 4200 may perform different processes.

The interface buffer 4400 provides a space in which the substrate W transferred between the coating blocks 30*a*, the additional process chambers 4200, the stepper 50, and the developing blocks 30*b* temporarily stays. A plurality of interface buffers 4400 may be provided. The interface buffers 4400 may be stacked one above another.

According to an embodiment, the additional process chambers 4200 may be disposed on one side of an extension line oriented in the lengthwise direction of the transfer chamber 3400, and the interface buffers 4400 may be disposed on an opposite side of the extension line.

The transfer member 4600 transfers the substrate W between the coating blocks 30*a*, the additional process chambers 4200, the stepper 50, and the developing blocks 30*b*. The transfer member 4600 may be implemented with one or more robots. According to an embodiment, the transfer member 4600 has the first robot 4602 and a second robot 4606. The first robot 4602 may transfer the substrate W between the coating blocks 30*a*, the additional process chambers 4200, and the interface buffers 4400. An interface robot 4606 may transfer the substrate W between the interface buffers 4400 and the stepper 50. The second robot 4606 may transfer the substrate W between the interface buffers 4400 and the developing blocks 30*b*.

The first robot 4602 and the second robot 4606 each include a hand on which the substrate W is placed, and the hand is movable forward and backward, rotatable about an axis parallel to the third direction 16, and movable along the third direction 16.

The hands of the index robot 2200, the first robot 4602, and the second robot 4606 may all have the same shape as the hand 3420 of the transfer robot 3422. Selectively, a hand of a robot that directly exchanges the substrate W with the transfer plate 3240 of each heat treatment chamber 3200 may have the same shape as the hand 3420 of the transfer robot 3422, and hands of the remaining robots may have a different shape from the hand 3420 of the transfer robot 3422.

According to an embodiment, the index robot 2200 may directly exchange the substrate W with the heating units 3230 of the front heat treatment chambers 3200 provided in the coating blocks 30*a*.

Furthermore, the transfer robots 3422 provided in the coating blocks 30*a* and the developing blocks 30*b* may directly exchange the substrate W with the transfer plates 3240 located in the heat treatment chambers 3200.

An embodiment of a method for treating a substrate using the above-described substrate treating apparatus 1 will be described below.

Coating process S20, edge exposing process S40, exposing process S60, and developing process S80 are sequentially performed on the substrate W.

Coating process S20 is performed by sequentially performing heat treatment process S21 in the heat treatment chamber 3200, anti-reflection film coating process S22 in the front liquid treating chamber 3602, heat treatment process S23 in the heat treatment chamber 3200, photoresist film coating process S24 in the rear liquid treating chamber 3604, and heat treatment process S25 in the heat treatment chamber 3200.

Hereinafter, an example of a transfer path of the substrate W from the carrier 10 to the stepper 50 will be described.

The index robot 2200 extracts the substrate W from the carrier 10 and transfers the substrate W to the front buffer 3802. The transfer robot 3422 transfers the substrate W stored in the front buffer 3802 to the front heat treatment chamber 3200. The substrate W is transferred to the heating unit 3230 by the transfer plate 3240. When a heating process is completely performed on the substrate W in the heating unit 3230, the transfer plate 3240 transfers the substrate W to the cooling unit 3220. The transfer plate 3240 is brought into contact with the cooling unit 3220 and performs a cooling process on the substrate W supported on the transfer plate 3240. When the cooling process is completed, the transfer plate 3240 moves above the cooling unit 3220, and the transfer robot 3422 extracts the substrate W from the heat treatment chamber 3200 and transfers the substrate W to the front liquid treating chamber 3602.

The front liquid treating chamber 3602 coats the substrate W with an anti-reflection film.

The transfer robot 3422 extracts the substrate W from the front liquid treating chamber 3602 and places the substrate W in the heat treatment chamber 3200. The heat treatment chamber 3200 sequentially performs the above-described heating and cooling processes. When each heat treatment process is completed, the transfer robot 3422 extracts the substrate W from the heat treatment chamber 3200 and places the substrate W in the rear liquid treating chamber 3604.

Thereafter, the rear liquid treating chamber 3604 coats the substrate W with a photoresist film.

The transfer robot 3422 extracts the substrate W from the rear liquid treating chamber 3604 and places the substrate W in the heat treatment chamber 3200. The heat treatment chamber 3200 sequentially performs the above-described heating and cooling processes. When each heat treatment process is completed, the transfer robot 3422 transfers the substrate W to the rear buffer 3804. The first robot 4602 of the interface module 40 extracts the substrate W from the rear buffer 3804 and transfers the substrate W to the additional process chamber 4200.

The additional process chamber 4200 performs an edge exposing process on the substrate W.

The first robot 4602 extracts the substrate W from the additional process chamber 4200 and transfers the substrate W to the interface buffer 4400.

The second robot 4606 extracts the substrate W from the interface buffer 4400 and transfers the substrate W to the stepper 50.

Developing process S80 is performed by sequentially performing heat treatment process S81 in the heat treatment chamber 3200, developing process S82 in the liquid treating chamber 3600, and heat treatment process S83 in the heat treatment chamber 3200.

Hereinafter, an example of a transfer path of the substrate W from the stepper 50 to the carrier 10 will be described.

The second robot 4606 extracts the substrate W from the stepper 50 and transfers the substrate W to the interface buffer 4400.

The first robot 4602 extracts the substrate W from the interface buffer 4400 and transfers the substrate W to the rear buffer 3804. The transfer robot 3422 extracts the substrate W from the rear buffer 3804 and transfers the substrate W to the heat treatment chamber 3200. The heat treatment chamber 3200 sequentially performs a heating process and a cooling process on the substrate W. When the cooling process is completed, the substrate W is transferred to the developing chamber 3600 by the transfer robot 3422.

The developing chamber 3600 performs a developing process by dispensing a developing solution onto the substrate W.

The substrate W is extracted from the developing chamber 3600 and placed in the heat treatment chamber 3200 by the transfer robot 3422. The heat treatment chamber 3200 sequentially performs a heating process and a cooling process on the substrate W. When the cooling process is completed, the substrate W is extracted from the heat treatment chamber 3200 and transferred to the front buffer 3802 by the transfer robot 3422.

The index robot 2200 extracts the substrate W from the front buffer 3802 and transfers the substrate W to the container 10.

The treating module 30 of the above-described substrate treating apparatus 1 has been described as performing the coating process and the developing process. However, the substrate treating apparatus 1 may include only the index module 20 and the treating module 30 without the interface module 40. In this case, the treating module 30 may perform only the coating process, and a film with which the substrate W is coated may be a spin-on hardmask (SOH) film.

According to the embodiments of inventive concept, the supply holes are formed in the first area containing the center, and the exhaust holes are formed in the second area surrounding the first area. Due to this, the gas may be prevented from being focused on the center or the outside.

In addition, according to the embodiments of inventive concept, the exhaust holes formed in the first area are offset from the central axis to exhaust the gas. Due to this, a temperature difference between the central area and the edge area may be minimized.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
a chamber having a treating space formed therein;
a substrate support unit configured to support the substrate in the treating space;
a plate located to face the substrate support unit in the treating space, the plate having a plurality of holes formed therein;
a gas supply unit configured to supply gas into the treating space through the holes; and
a gas exhaust unit configured to exhaust the gas in the treating space through the holes,
wherein the plate has a plurality of first exhaust holes and a plurality of first supply holes formed in a central area thereof, the first exhaust holes being configured to exhaust the gas in an intervening space between the plate and the substrate support unit, and the first supply holes being surrounded by the first exhaust holes and configured to supply the gas into the intervening space, and
wherein the plate has a plurality of second supply holes formed outside the central area thereof, the second supply holes being configured to supply the gas into the intervening space.

2. The apparatus of claim 1, wherein the plate has a second exhaust hole formed therein, the second exhaust hole being located outside the second supply holes and configured to exhaust the gas in the intervening space.

3. The apparatus of claim 2, wherein a diffusion space connected to the first supply holes and the second supply holes is formed inside the plate.

4. The apparatus of claim 3, wherein the apparatus further comprises an intermediate body coupled to an upper surface of the plate, and
wherein the intermediate body has a buffer space in which the gas introduced from an outside is firstly spread before delivered to the diffusion space.

5. The apparatus of claim 4, wherein a plurality of buffer holes configured to connect the buffer space and the diffusion space are formed in a bottom of the intermediate body, and
wherein when viewed from above, the buffer space is located to cover the first supply holes, and the buffer holes are located so as not to overlap the first supply holes.

6. The apparatus of claim 5, wherein the intermediate body has a stepped shape having a recess formed on an upper surface thereof, and the upper surface of the intermediate body is combined with a ceiling of the chamber to form a first exhaust space,
wherein the first exhaust holes extend upward independently of the diffusion space and the buffer space and connect to the first exhaust space, and
wherein the gas exhaust unit includes a first pressure-reducing member configured to evacuate the first exhaust space.

7. The apparatus of claim 6, wherein the intermediate body has a smaller width than the plate,
wherein the second exhaust hole is connected to a second exhaust space formed by a combination of the plate, the ceiling, and the intermediate body, and
wherein the gas exhaust unit includes a second pressure-reducing member configured to evacuate the second exhaust space.

8. The apparatus of claim 6, wherein an introduction hole, defined by the intermediate body, extends downward to bypass the first exhaust space, connecting the buffer space to an inflow hole defined by a top of the chamber.

9. The apparatus of claim 7, wherein the second exhaust holes extend to bypass the diffusion space and the buffer space.

10. The apparatus of claim 7, wherein a first outlet hole defined by the ceiling of the chamber is aligned with the first exhaust space and a second outlet hole defined by the ceiling of the chamber is aligned with the second exhaust space.

11. The apparatus of claim 1, wherein each diameter of each of the first exhaust holes is greater than respective diameters of each of the respective first supply holes.

12. An apparatus for treating a substrate, the apparatus comprising:
a chamber having a treating space formed therein;
a substrate support unit configured to support the substrate in the treating space;
a gas flow generation unit including a plate located to face the substrate support unit in the treating space, the plate having a plurality of holes formed therein;
a gas supply line configured to supply gas to some of the holes; and
a gas exhaust line configured to exhaust the gas from other holes,
wherein the plate has a plurality of first supply holes and a plurality of first exhaust holes formed in a first area thereof and a plurality of second supply holes and a plurality of second exhaust holes formed in a second area thereof, wherein the first area contains the center of the plate, and the second area surrounds the first area.

13. The apparatus of claim 12, wherein when viewed from above, the first supply holes are located to overlap the center of the plate, the first exhaust holes are located to surround the first supply holes, and the second exhaust holes are located to surround the second supply holes.

14. The apparatus of claim 13, wherein a diffusion space connected to the first supply holes and the second supply holes is formed inside the plate,
wherein the gas flow generation unit further includes an intermediate body coupled to the plate to connect the gas supply line and the gas exhaust line to the holes formed in the plate, and
wherein the intermediate body has a buffer space formed therein and a plurality of buffer holes formed in a bottom thereof, wherein the gas supply line is connected to the buffer space, and the buffer holes connect the buffer space and the diffusion space.

15. The apparatus of claim 14, wherein when viewed from above, the buffer space is located to cover the first area, and the buffer holes are located so as not to overlap the first supply holes.

16. The apparatus of claim 15, wherein the intermediate body has a container shape having a recess formed on an upper surface thereof,
wherein the first exhaust holes extend from the plate to the recess, and
wherein the first exhaust holes are provided independently of the diffusion space and the buffer space.

17. The apparatus of claim 14, wherein an upper surface of the intermediate body and a ceiling of the chamber are combined with each other to form a first exhaust space connected to the first exhaust holes,
wherein the plate is located below the intermediate body so as to be spaced apart from the ceiling of the chamber and forms a second exhaust space connected to the second exhaust holes, and
wherein the gas exhaust line includes:
a first line connected to the first exhaust space; and
a second line connected to the second exhaust space.

18. The apparatus of claim 17, wherein a pressure-reducing member is connected to each of the first line and the second line.

19. The apparatus of claim 18, where the pressure reducing member connected to the first line and second line comprises a first pressure-reducing member connected to the first line and a second pressure-reducing member connected to the second line, the first pressure-reducing member and the second pressure-reducing member are configured to be independently controlled and configured to reduce the pressure in the first exhaust space and second exhaust space to different pressures.

20. The apparatus of claim 17, wherein when viewed from above, the first exhaust holes are located to overlap the first exhaust space.

* * * * *